US007598673B2

(12) United States Patent
Hur et al.

(10) Patent No.: US 7,598,673 B2
(45) Date of Patent: Oct. 6, 2009

(54) PLASMA DISPLAY PANEL WITH ENHANCED LUMINOUS EFFICIENCY AT A REDUCED DISCHARGE FIRING VOLTAGE

(75) Inventors: Min Hur, Suwon-si (KR); Hoon-Young Choi, Suwon-si (KR)

(73) Assignee: Samsung SDI Co., Ltd., Suwon-Si (KR)

( * ) Notice: Subject to any disclaimer, the term of this patent is extended or adjusted under 35 U.S.C. 154(b) by 444 days.

(21) Appl. No.: 11/322,507

(22) Filed: Dec. 30, 2005

(65) Prior Publication Data

US 2006/0170357 A1 Aug. 3, 2006

(30) Foreign Application Priority Data

Jan. 20, 2005 (KR) ..................... 10-2005-0005292

(51) Int. Cl.
*H01J 17/49* (2006.01)
*G09G 3/28* (2006.01)
*H01L 29/04* (2006.01)

(52) U.S. Cl. ....................... 313/582; 313/581; 313/587; 313/584; 313/585; 315/169.4; 315/169.2; 345/63

(58) Field of Classification Search .......... 313/581–587
See application file for complete search history.

(56) References Cited

U.S. PATENT DOCUMENTS

| | | | | |
|---|---|---|---|---|
| 4,162,427 | A * | 7/1979 | Kamegaya et al. | 315/169.1 |
| 5,744,909 | A * | 4/1998 | Amano | 313/585 |
| 7,304,433 | B2 * | 12/2007 | Hur et al. | 313/585 |
| 2003/0184226 | A1 * | 10/2003 | Setoguchi et al. | 313/584 |
| 2004/0227464 | A1 * | 11/2004 | Hashikawa et al. | 313/584 |
| 2006/0103304 | A1 * | 5/2006 | Hur et al. | 313/567 |

FOREIGN PATENT DOCUMENTS

| | | |
|---|---|---|
| JP | 2001-273855 | 10/2001 |
| JP | 2005-116453 | 4/2005 |
| JP | 2005-122968 | 5/2005 |
| KR | 10-2005-0105750 | 11/2005 |
| KR | 10-2005-0114056 | 12/2005 |
| TW | 1224349 B | 11/2004 |

* cited by examiner

*Primary Examiner*—Sikha Roy
*Assistant Examiner*—Tracie Green
(74) *Attorney, Agent, or Firm*—Knobbe Martens Olson & Bear LLP

(57) ABSTRACT

A plasma display panel exhibiting a reduced discharge firing voltage and/or improved luminescence efficiency is disclosed. In one embodiment, the plasma display panel includes first and second substrates facing each other with a predetermined gap such that a plurality of discharge cells are formed in a space therebetween, wherein each discharge cell comprises an address electrode elongated in a first direction, a pair of first electrodes elongated in a second direction crossing the first direction, and a pair of second electrodes elongated in a second direction, and wherein each discharge cell includes a pair of discharge spaces, the pair of first electrodes are disposed at opposite sides of the each discharge cell, and the pair of second electrodes are disposed substantially at a center of the discharge cell, between the pair of first electrodes, and parallel with each other.

25 Claims, 10 Drawing Sheets

PLASMA DISPLAY PANEL WITH ENHANCED LUMINOUS EFFICIENCY AT A REDUCED DISCHARGE FIRING VOLTAGE

CROSS-REFERENCE TO RELATED APPLICATION

This application claims priority to and the benefit of Korean Patent Application No. 10-2005-0005292 filed in the Korean Intellectual Property Office on Jan. 20, 2005, the entire content of which is incorporated herein by reference.

BACKGROUND OF THE INVENTION

1. Technical Field

The present application relates to a plasma display panel (PDP). More particularly, the present application relates to a PDP with enhanced luminescence efficiency at a reduced discharge firing voltage.

2. Discussion Of Related Technologies

A three-electrode surface-discharge type plasma display panel (PDP) is an example of a common type of PDP. The three-electrode surface-discharge type PDP includes a front substrate and a rear substrate, and a discharge gas filling the space formed therebetween.

Parallel sets of elongated sustain electrodes and scan electrodes are provided on the interior surface of the front substrate. Elongated address electrodes are provided on the rear substrate, which is spaced apart from the front substrate. The address electrodes extend in a direction that intersects the direction of (i.e., not parallel with) the sustain electrodes and scan electrodes. Discharge cells are formed between the front and rear substrates, each of which is associated with a sustain electrode, a scan electrode, and an address electrode.

In a three-electrode surface-discharge type PDP, a discharge cell is selected by an address discharge between the sustain and address electrodes, which are controlled independently. In addition, a glow discharge is generated in the selected discharge cell by a sustain discharge between the sustain and scan electrodes disposed on the interior of the front substrate.

Visible light is generated from the glow discharge in a multistep process. In a glow discharge, collisions between electrons and discharge gas molecules generate vacuum ultraviolet (VUV) radiation. Absorbing VUV radiation causes a phosphor layer in the discharge cell to fluoresce, thereby generating visible light. An observer views the visible light through a transparent front substrate.

Typically, power losses at various stages of the discharge process described above result in a substantial overall power loss. For example, the glow discharge is triggered by applying a voltage higher than a discharge firing voltage between the sustain electrode and the scan electrode. That is, a very high voltage is required to trigger the glow discharge. Once a glow discharge is triggered, the voltage distribution between the cathode and the anode of a discharge cell is distorted by a space charge effect formed at a dielectric layer near the cathode and the anode. In particular, a cathode sheath region, an anode sheath region, and a positive column region form between the electrodes. The cathode sheath region forms near the cathode and consumes a majority of the voltage applied to the electrodes. The anode sheath region forms near the anode and consumes only a part of the applied voltage. The positive column region forms between the two sheath regions and consumes a negligible amount of the applied voltage.

A portion of the power dissipated at these regions heats the electrons in the discharge cell. The efficiency of the electron heating is referred to herein as the "electron heating efficiency." The electron heating efficiency of the cathode sheath region depends on a secondary electron emission coefficient of a protective layer, typically, a MgO layer, formed over the scan and sustain electrodes. The electron heating efficiency of the positive column region is typically high.

As discussed above, collisions between a discharge gas, for example, xenon gas, and electrons generate excited state xenon atoms. Relaxation of the excited state xenon atoms back to the ground state generates vacuum ultraviolet (VUV) radiation. Consequently, a method for increasing the luminescence efficiency (i.e., a ratio of the visible light to the input power) of a PDP is to increase the collisions between the electrons and the xenon gas. Increasing the electron heating efficiency increases the number and energy of collisions between the electrons and the xenon gas, thereby increasing the luminescence efficiency.

As discussed above, most of the input power is consumed in the cathode sheath region; however, the electron heating efficiency is low in that region. By contrast, the positive column region consumes only a small portion of the input power, but the electron heating efficiency is very high. Accordingly, increasing the size of the positive column region, for example, by increasing a discharge gap between the electrodes, increases the luminescence efficiency.

The luminescence efficiency also increases in a discharge gas comprising xenon and neon as a partial pressure of xenon increases. Electron consumption ratios (the ratio of consumed electrons to all electrons) for xenon excitation ($Xe^*$), xenon ionization ($Xe^+$), neon excitation ($Ne^*$), and neon ionization ($Ne^+$) depend on a reduced electric field (the ratio E/n, where, E is the electric field at the discharge gap and n is gas density). For a given value of reduced electric field (E/n), the electron energy decreases as the partial pressure of xenon increases. As the electron energy decreases, the electron consumption ratio for the xenon excitation increases. Because VUV radiation is generated by the relaxation of xenon from an excited state to the ground state, the luminescence efficiency also increases as the electron consumption ratio for the xenon excitation increases.

As discussed above, both increasing the size of the positive column region, and increasing the partial pressure of xenon in the discharge gas increase the electron heating efficiency in xenon excitation ($Xe^*$). Therefore, either or both of these features can be used for increasing the electron heating efficiency, thereby improving the luminescence efficiency. Increasing either or both the positive column region and/or the partial pressure of xenon typically requires an increased discharge firing voltage, which also increases the manufacturing cost of a PDP, however. Consequently, it is would be desirable to keep the discharge firing voltage at a low level while simultaneously improving the luminescence efficiency by increasing the size of the positive column region and/or the partial pressure of xenon in the discharge gas. For a given discharge gap and gas pressure, the discharge firing voltage is generally lower in an opposed discharge configuration, in which scan and sustain electrodes face each other, than in a surface discharge configuration described above.

The disclosure in this Background section is provided only to aid the reader in understanding of the background of the invention and may contain information not be known to a person of ordinary skill in the art. Accordingly, the information disclosed in the Background section is not admitted to be prior art.

SUMMARY OF CERTAIN INVENTIVE ASPECTS

Embodiments of the present invention provide a plasma display panel featuring a combination of reduced discharge firing voltage and/or increased luminescence efficiency.

An exemplary plasma display panel according to some embodiments includes first and second substrates, an address electrode, a pair of first electrodes, and a pair of second electrodes. The first and second substrates face each other with a predetermined gap therebetween, and a plurality of discharge cells formed in the gap. Each of the discharge cells comprises a first and a second discharge space. The address electrode is elongated in a first direction and is disposed between the first and second substrates. The pair of first electrodes are disposed between the first and second substrates and are elongated in a second direction that crosses the first direction. The pair of first electrodes are disposed at opposite sides of each discharge cell and separated from the address electrode. The pair of second electrodes are elongated in the second direction and are disposed across each discharge cell substantially at a center thereof, substantially in parallel with each other, and between the pair of first electrodes. Each of the first and second discharge spaces is associated with one of the first electrodes and one of the second electrodes.

In some embodiments, the address electrode includes an elongated portion elongated in the first direction and disposed at a boundary of the discharge cell, a first protruding portion extending from the elongated portion of the address electrode toward an interior of the first discharge space; and a second protruding portion extending from the elongated portion of the address electrode toward an interior of the second discharge space.

In some embodiments, the first protruding portion of the address electrode extends between the first and second electrodes in the first discharge.

In some embodiments, the second protruding portion of the address electrode extends between the first and second electrodes in the second discharge space.

In some embodiments, the first and second protruding portions of the address electrode are biased positions toward the respective second electrodes of each discharge space.

In some embodiments, for each discharge space, a distance between the second electrode and the protruding portion of the address electrode therein is smaller than a distance between the first electrode and the protruding portion of the address electrode therein.

In some embodiments, at least one first electrode is shared by discharge cells adjacent in the first direction.

In some embodiments, at least one first electrode includes an elongated portion and an expanded portion wherein the elongated portion is disposed at the opposite sides of the discharge cell and elongated in the second direction; and the expanded portion extends from the elongated portion in a direction perpendicular to the first substrate. In some embodiments, at least one second electrode includes an elongated portion and an expanded portion wherein the elongated portion is dimensioned and configured to correspond to the elongated portion of the at least one first electrode, and the expanded portion is dimensioned and configured to correspond to the expanded portion of the at least one first electrode.

In some embodiments, the rearmost portion of at least one of the first and second electrodes is closer to the front substrate than the frontmost portion of the address electrode.

In some embodiments, rearmost portion of at least one of the first and second electrodes overlaps the address electrode in a vertical direction from the substrate.

In some embodiments, at least one of the first and second electrodes comprises a metal electrode.

In some embodiments, an insulating dielectric layer is disposed on at least one of the first electrodes, the second electrodes, and the address electrode. In some embodiments, a protective layer is disposed on at least one of the dielectric layers.

In some embodiments, a separate dielectric layer may is disposed on each of the pair of second electrodes. In other embodiments, a single dielectric layer is disposed on both of the pair of second electrodes disposed substantially at the center of the discharge cell. In some embodiments, the dielectric layer may disposed on both of the pair of second electrodes substantially does not comprise a void or hollow space between the pair of second electrodes.

Some embodiments of the exemplary plasma display panel further include first and second barrier rib layers, wherein the first barrier rib layer is formed on the first substrate, forming a first substrate side discharge space of the discharge cell, and the second barrier rib layer formed on the second substrate, forming a second substrate side discharge space of the discharge cell.

In some embodiments, the volume of the second substrate side discharge space is larger than the volume of the first substrate side discharge space.

In some embodiments, the first barrier rib layer includes a first barrier rib member elongated in the first direction, and the second barrier rib layer includes a second barrier rib member elongated in the first direction. In some embodiments, the first barrier rib layer further includes a third barrier rib member crossing the first barrier rib member, and the second barrier rib layer further includes a fourth barrier rib member crossing the second barrier rib member.

Some embodiments further include a first phosphor layer formed on a surface of the first substrate, and a second phosphor layer formed on a surface of the second substrate. In some embodiments, the first phosphor layer is thicker than the second phosphor layer.

In some embodiments, a dark mask layer is formed proximal to the second substrate, wherein the shape of the dark mask layer substantially corresponds to the shape of at least one of the address electrode, a first electrode, and a second electrode.

In some embodiments, a sustain pulse is applied to the first electrode in a sustain period, a scan pulse is applied to the second electrode in an address period, a sustain pulse is applied to the second electrode in the sustain period, and the first electrodes are shared by discharge cells adjacent in the first direction, wherein the first and second electrodes are repeated in the first direction in an arrangement comprising a second electrode, a first electrode, and a second electrode.

In some embodiments, the address electrode includes an elongated portion elongated in the first direction and disposed at a boundary of the discharge cell, a first protruding portion extending from the elongated portion of the address electrode toward an interior of the first discharge space, and a second protruding portion extending from the elongated portion of the address electrode toward an interior of the second discharge space; wherein the first, second, and address electrodes are repeated in the first direction in an arrangement comprising a second electrode, an address electrode, a first electrode, the address electrode, and a second electrode.

DETAILED DESCRIPTION OF EMBODIMENTS

Figure 1:
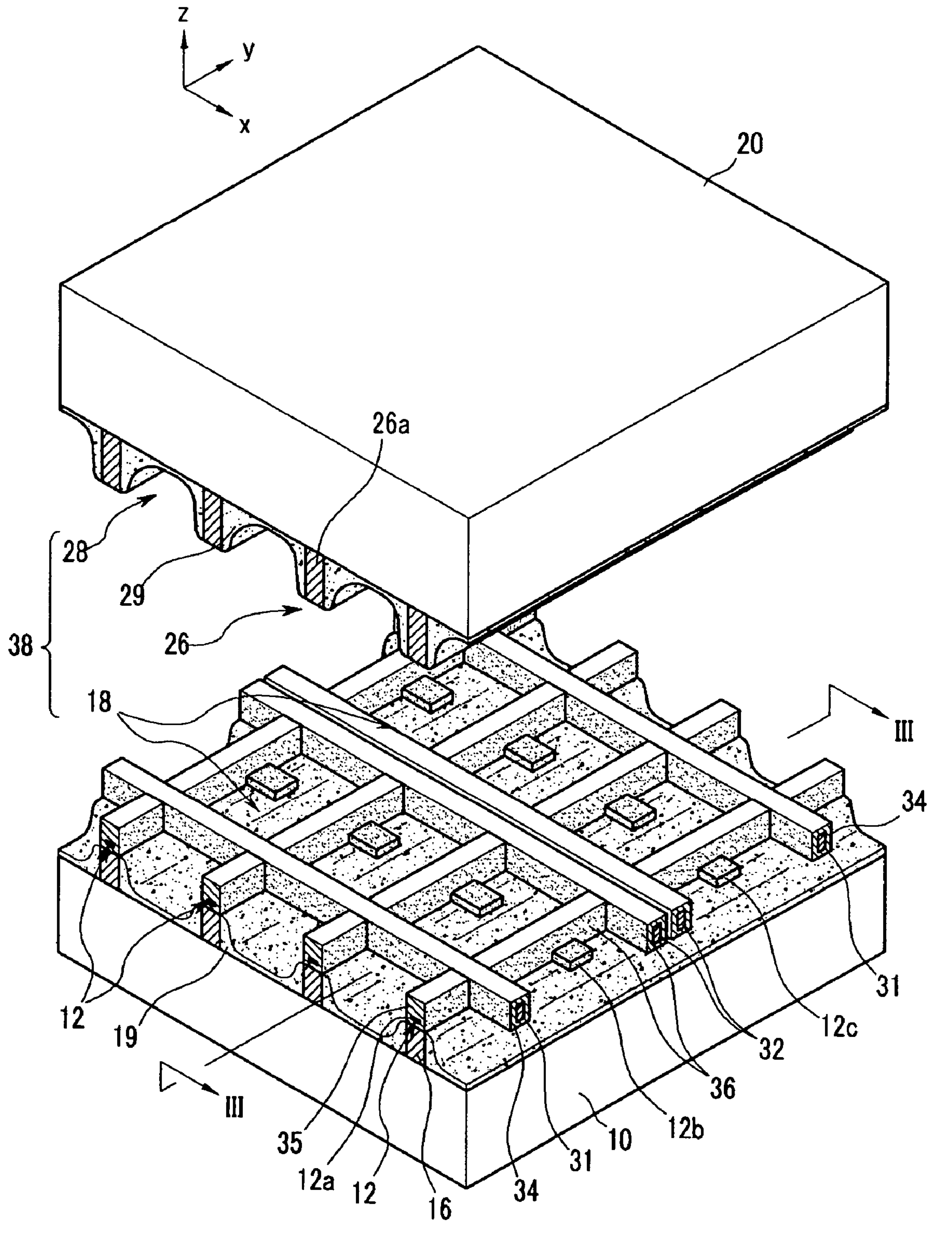
FIG. 1 is a partial, exploded perspective view of a PDP according to a first exemplary embodiment of the present invention.

With reference to the accompanying drawings, embodiments of the present invention will be described in sufficient detail for those skilled in the art to implement. As those skilled in the art will realize, the described embodiments may be modified in various ways without departing from the spirit or scope of the present disclosure. Wherever possible, the same reference numbers will be used throughout the drawing(s) to refer to the same or like parts.

Figure 2:
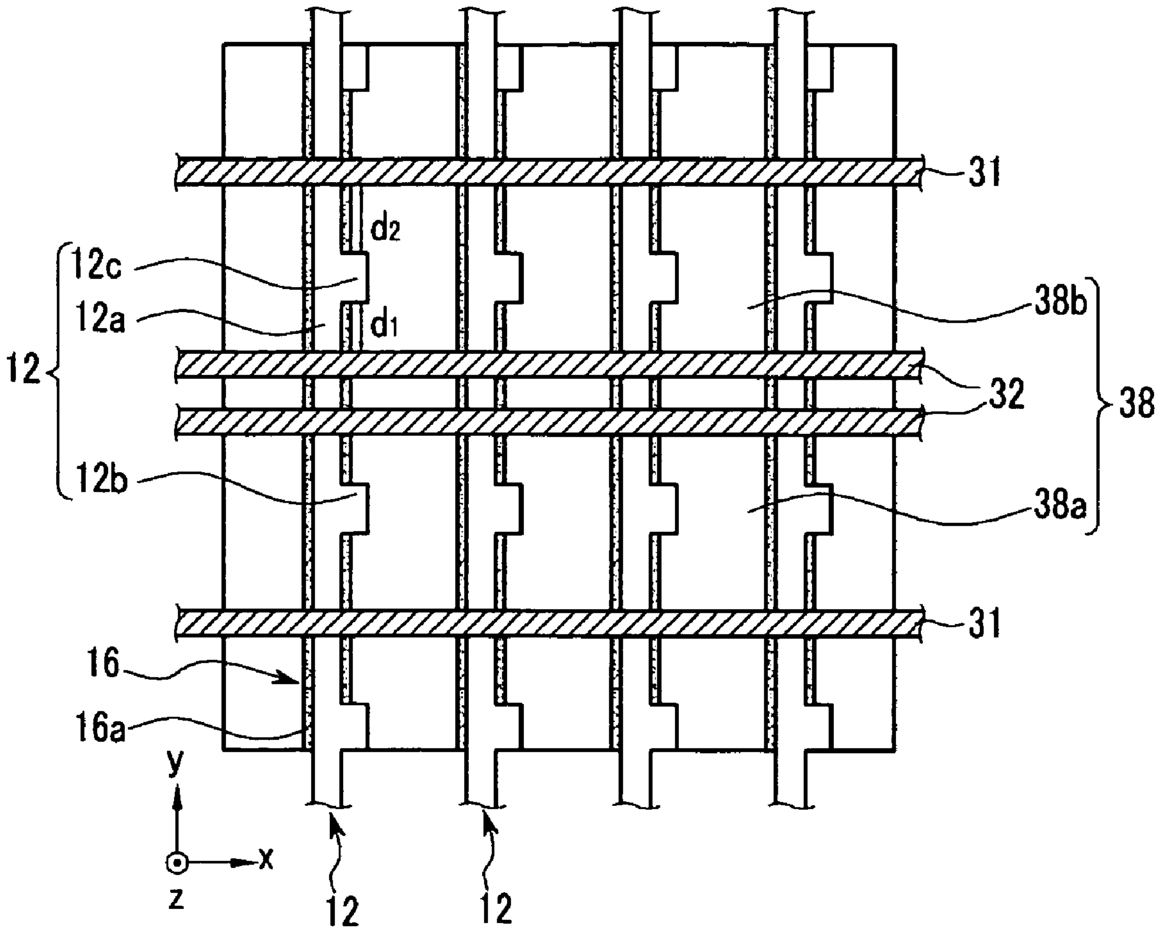
FIG. 2 is a top plan view illustrating a schematic arrangement of electrodes and discharge cells in a PDP according to a first exemplary embodiment of the present invention.
Figure 3:
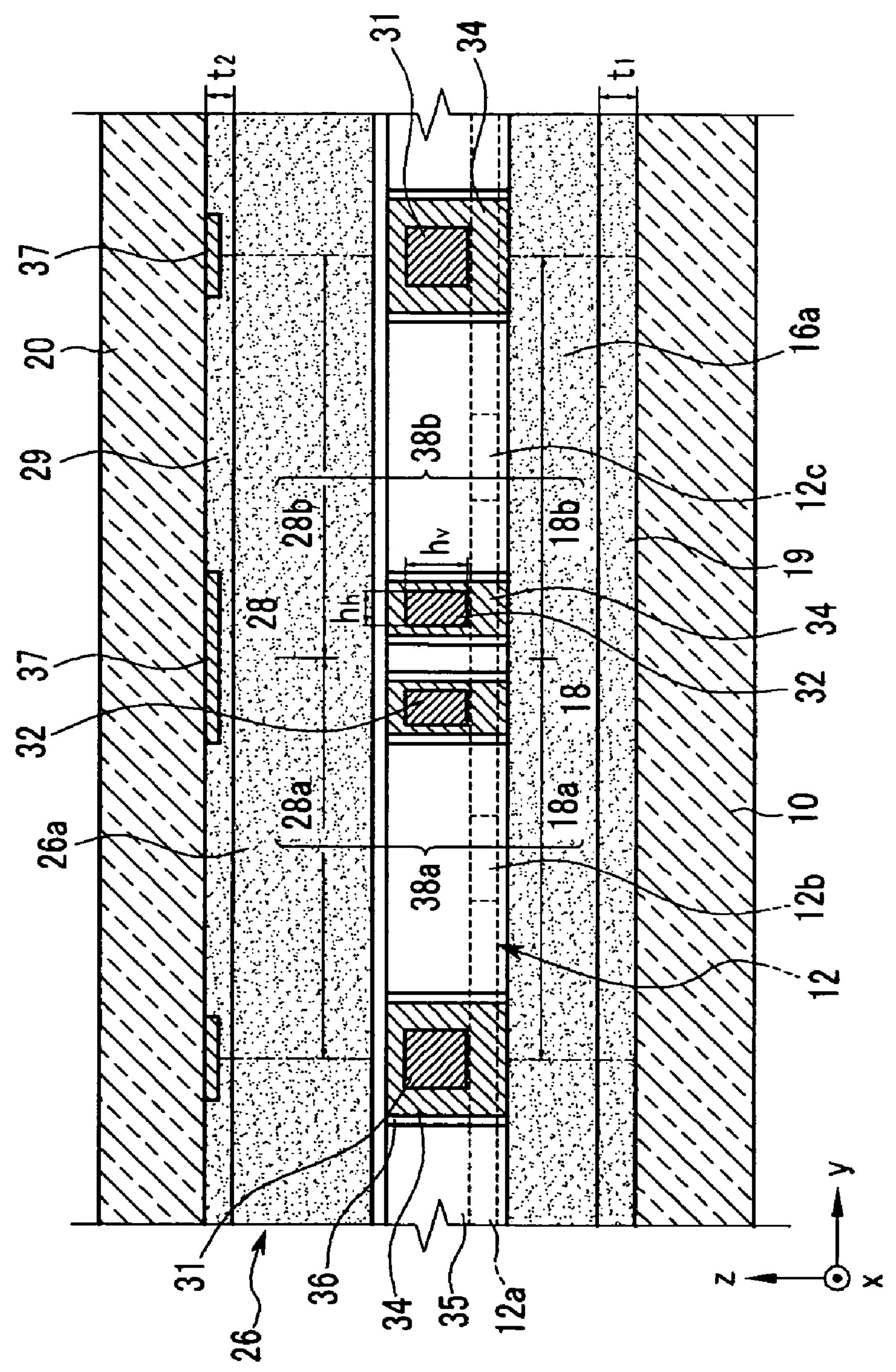
FIG. 3 is a cross-sectional view taken along the line III-III of the PDP illustrated in FIG. 1.

FIG. 1 is a partial, exploded perspective view of a PDP according to a first exemplary embodiment of the present invention, FIG. 2 is a top plan view showing schematic arrangement of electrodes and discharge cells in a PDP according to a first exemplary embodiment of the present invention, and FIG. 3 is a cross-sectional view taken along a line III-III of the PDP shown in FIG. 1.

As shown in the drawings, a PDP according to an exemplary embodiment of the present invention includes a first substrate 10, a second substrate 20, a layer of first barrier ribs 16, and a layer of second barrier ribs 26. The first substrate 10 (hereinafter "rear substrate") and the second substrate 20 (hereinafter "front substrate") are oppositely disposed with a predetermined gap therebetween. The first and second barrier rib layers 16 and 26 are disposed between the rear and front substrates 10 and 20, and form discharge spaces 18 and 28, respectively.

In more detail, the first barrier ribs 16 (hereinafter "rear-plate barrier ribs") partition the discharge spaces 18, and the second barrier ribs 26 (hereinafter "front-plate barrier ribs") partition the discharge spaces 26. The two discharge spaces 18 and 26 together form a discharge cell 38.

First and second phosphor layers 19 and 29, respectively, are formed in the discharge spaces 18 and 28, respectively. A discharge gas (e.g., a mixed gas of neon (Ne), xenon (Xe), etc.) fills the discharge cell 38. A plasma discharge in the discharge cell generates vacuum ultraviolet (VUV) radiation.

The rear-plate barrier rib 16 extends from the rear substrate 10 toward the front substrate 20. Similarly, the front-plate barrier rib 26 extends from the front substrate 20 toward the rear substrate 10.

As described above, the rear-plate barrier ribs 16 partition and form discharge spaces 18 adjacent to the rear substrate 10. Each discharge cell 18 formed adjacent to the rear substrate 10 comprises a pair of discharge spaces **18*a* and 18*b*, which are best viewed in FIG. 3**.

In the same way, the front-plate barrier ribs 26 partition and form discharge spaces 28 adjacent to the front substrate 20. Each discharge cell 28 formed adjacent to the front substrate 20 comprises a pair of discharge spaces **28*a* and 28*b***.

The discharge spaces 18 and 28, which are adjacent in the z-axis direction, together form a single effective discharge cell 38. In the y-axis direction, the discharge cell 38 comprises a pair of a discharge spaces **38*a* and 38*b*. Discharge space 38*a* comprises discharge spaces 18*a* and 28*a*, and discharge space 38*b* comprises discharge spaces 18*b* and 28*b***.

In the illustrated embodiment, the discharge spaces **28*a* and 28*b* formed at the front substrate 20 by the front-plate barrier ribs 26 have larger volumes than the discharge spaces 18*a* and 18*b* formed at the rear substrate 10 by the rear-plate barrier ribs 16. The illustrated configuration enhances transmission of visible light generated in the discharges spaces 38*a* and 38*b*** through the front substrate.

Some embodiments of the discharge spaces 18 and 28 formed by rear-plate barrier ribs 16 and front-plate barrier ribs 26 have different shapes, for example, triangular, quadrilateral, or hexagonal. In the illustrated embodiment, the discharge spaces 18 and 28 are substantially rectangular and/or square. In some embodiments, the discharge spaces 18 and 28 are independent of each other. That is, although the discharge spaces 18 and 28 in the illustrated embodiment are formed in a striped pattern and together form one effective discharge cell 38, in other embodiments, the discharge spaces 18 and 28 have a different configuration.

In the illustrated embodiment, each rear-plate barrier rib 16 formed at the rear substrate 10 comprises a first barrier rib member **16*a* elongated in a first direction (e.g., the y-axis direction). The first barrier rib member 16*a* extends toward the front substrate 20. Each front-plate barrier rib 26 formed at the front substrate 20 comprises a second barrier rib member 26*a* extending toward the rear substrate 10, and which is dimensioned and configured to correspond to the first barrier rib member 16*a***.

The first phosphor layer 19 is formed in the rear discharge spaces **18*a* and 18*b*. The second phosphor layer 29 is formed in the front discharge spaces 28*a* and 28*b*. The first and second phosphor layers 19 and 29 generate visible light at both sides of the discharge space 38*a* and also at both sides of the discharge space 38*b*, thereby enhancing luminescence efficiency. As discussed above, the pair of the discharge spaces 18*a* and 18*b* and the facing pair of discharge spaces 28*a* and 28*b* together form the pair of discharge spaces 38*a* and 38*b*. Therefore, in preferred embodiments, the first and second phosphor layers 19 and 29 formed in the discharge spaces 18 and 28 are formed of phosphors that produces visible light of the same or similar color. In the illustrated embodiment, the first phosphor layer 19 in the discharge space 18 is formed on the sides of the first barrier rib members 16*a* and on the portion of the rear substrate 10 between the first barrier rib members 16***a*. The second phosphor layer 29 in the discharge space 28 is formed on the sides of the second barrier rib members 26*a* and on the portion of the surface of the front substrate 20 between the second barrier rib members 26*a*.

In some embodiments, the first phosphor layer 19 is formed by applying a phosphor on a dielectric layer (not illustrated) formed on the rear substrate 10. Other embodiments do not comprise a dielectric layer formed on the rear substrate 10. Similarly, in some embodiments, the second phosphor layer 29 is formed by applying a phosphor on a dielectric layer (not illustrated) formed on the front substrate 20. Other embodiments do not comprise a dielectric layer formed on the front substrate 20.

In other embodiments, one or both of the rear and/or front substrates 10 and 20 are etched to form the discharge spaces 18 and 28, thereby forming an integrated substrate/barrier rib structure. The first and second phosphor layers 19 and 29 are formed in the resulting discharge spaces 18 and/or 28. In embodiments in which the rear-plate barrier rib 16 and the rear substrate 10 are integrated, they comprise the same material. In embodiments in which the front-plate barrier rib 26 and the front substrate 20 are integrated, they comprise the same material.

During a sustain discharge, the first phosphor layer 19 in the discharge space 18 absorbs vacuum ultraviolet (VUV) radiation and emits visible light through the front substrate 20. The second phosphor layer 29 in the discharge space 28 absorbs vacuum ultraviolet (VUV) radiation and emits visible light through the front substrate 20. In the illustrated embodiment, the thickness ($t_1$) of the first phosphor layer 19 formed over the rear substrate 10 is greater than the thickness ($t_2$) of the second phosphor layer 29 formed over the front substrate 20 because visible light is transmitted through that portion of the second phosphor layer 29. The illustrated configuration improves the utilization of the vacuum ultraviolet (VUV) radiation, thereby improving the luminescence efficiency of the device.

As discussed above, the vacuum ultraviolet (VUV) radiation is generated by a glow or plasma discharge. A plasma discharge is generated in the discharge cell 38 using an address electrode 12, a first electrode 31 ("sustain electrode"), and a second electrode 32 ("scan electrode").

In the illustrated embodiment, the address electrode 12 is elongated in the first direction (y-axis direction) and is disposed between the rear-plate barrier rib 16 and the front-plate barrier rib 26 with respect to the z-axis direction. That is, the address electrode 12 is elongated in a direction of the first barrier rib member 16*a*. As illustrated in FIG. 1, a plurality of address electrodes 12 are disposed in parallel, with a spacing corresponding to the width of the discharge space 18, and corresponding to the first barrier rib members 16*a*.

The sustain electrode 31 and the scan electrode 32 are disposed between the rear-plate barrier rib 16 and the front-plate barrier rib 26 that together form the discharge spaces 38*a* and 38*b*. In the illustrated embodiment, the sustain 31 and scan 32 electrodes are electrically insulated from the address electrode 12, and are elongated along a second direction (e.g., the x-axis direction), which intersects or crosses the first direction (e.g., the y-axis direction) of the address electrode 12. In the illustrated embodiment, the first and second directions are substantially perpendicular. As discussed above, each discharge cell 38 comprises a pair of discharge spaces 38*a* and 38*b*. In the illustrated embodiment, a pair of sustain electrodes 31 are disposed substantially parallel to each other at opposite sides (in the y-axis direction) of the discharge cell 38, thereby defining two of the sides of the discharge cell 38. A pair of scan electrodes 32 are disposed between and substantially parallel to the sustain electrodes 31, thereby partitioning the discharge cell 38 into the discharge spaces 38*a* and 38*b* (FIG. 3). In the illustrated embodiment, the pair of scan electrodes 32 is located substantially at the center of the discharge cell 38.

In the illustrated embodiment, one set of sustain and scan electrodes 31 and 32 is dimensioned and configured to generate a sustain discharge in the discharge space 38*a*, and another set of scan and sustain electrodes 32 and 31 is dimensioned and configured to generate a sustain discharge in the discharge space 38*b*. In the illustrated embodiment, the first and second barrier rib members 16*a* and 26*a* define a discharge space that is open along the y-axis direction, and the open discharge space is divided into open discharge spaces 38*a* and 38*b* therein.

The address electrode 12 comprises an elongated portion 12*a* and first and second protruding portions 12*b* and 12*c*. The elongated portion 12*a* is elongated in they-axis direction and disposed at a boundary of the discharge cell 38. The first protruding portion 12*b* protrudes from the elongated portion 12*a* toward and into the discharge space 38*a*, and the second protruding portion 12*c* protrudes from the elongated portion 12*a* toward and into the discharge space 38*b*. In the illustrated embodiment, the first protruding portion 12*b* extends between the scan and sustain electrodes 31 and 32 corresponding to the discharge space 38*a*, and the second protruding portion 12*c* extends between the sustain and scan electrodes 32 and 31 corresponding to the discharge space 38*b*, and are dimensioned and configured to generate address discharges in the respective discharge spaces 38*a* and 38*b*. The first and second protruding portions 12*b* and 12*c* of the address electrode 12 conduct an address pulse to the discharge spaces 38*a* and 38*b*, respectively. In some embodiments, a discharge gap between the address electrode 12 and the scan electrode 32 is a small gap, thereby reducing the address discharge voltage.

As described above, in the illustrated embodiment, the sustain electrodes 31 are disposed between and cross the first and second barrier rib members 16*a* and 26*a*. Sustain electrodes 31 are disposed at opposite sides of each discharge cell 38 in the y-axis direction, and are parallel with each other. The scan electrodes 32 are also disposed between and cross the first and second barrier rib members 16*a* and 26*a*. A pair of scan electrodes 32 is disposed substantially at a center of the discharge cell, parallel to the sustain electrodes 31.

In the illustrated embodiment, the sustain electrodes 31 define discharge cells 38 that are adjacent in the y-axis direction. Each sustain electrode 31 is commonly shared by discharge cells 38 adjacent in the y-axis direction, and contributes to the sustain discharges of the adjacent discharge cells 38.

In the illustrated embodiment, a pair of scan electrodes 32 is disposed substantially at a center of the discharge cell 38, dividing the discharge cell 38 into the discharge spaces 38*a* and 38*b*. Each of the scan electrodes 32 in the pair contributes to the sustain discharge in the respective discharge space 38*a* or 38*b*.

In an address period, an address discharge is generated between a scan electrode 32 and the corresponding address electrode 12, thereby selecting a discharge cell 38 for a sustain discharge. In a sustain period, a sustain discharge is generated between a sustain electrode 31 and a scan electrode 32, generating a glow discharge, which ultimately forms an image as discussed above.

Figure 10:
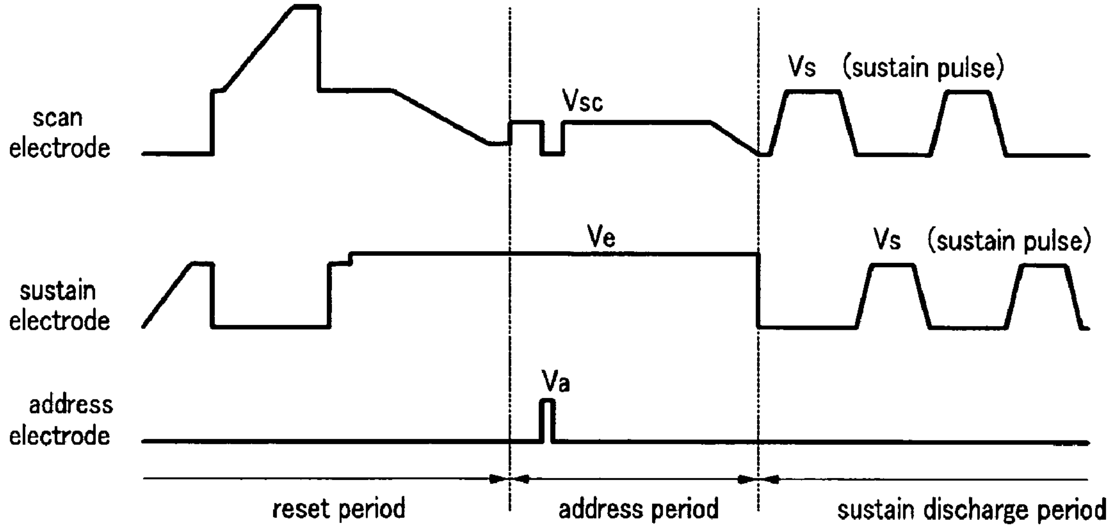
FIG. 10 illustrates exemplary driving signals applicable to a PDP according to exemplary embodiments of the present invention.

FIG. 10 illustrates an embodiment of voltage pulse sequences applied to the scan 32, sustain 31, and address 12 electrodes in the reset, address, and sustain discharge periods. In the sustain period, sustain pulses $V_s$ are applied to a sustain electrode 31 and a scan electrode 32. During the address period, scan pulses $V_{sc}$ are applied to the scan electrode, and address pulses $V_a$ are applied to the address electrode 12. It will be understood by those skilled in the art, however, that other embodiments use different pulse sequences, and that the functions of the electrodes may change depending on their signal voltages.

In each of the discharge spaces 38*a* and 38*b*, the sustain electrode 31 and scan electrode 32 are opposite each other, and thus a sustain discharge generated therein is an opposed discharge. In an opposed discharge, the discharge firing voltage for generating a sustain discharge varies inversely with the surface area of the discharge structure. The embodiment illustrated in FIG. 4 includes increased discharge areas on the sustain 31 and scan 32 electrodes. In the illustrated embodiment, the sustain electrode 31 comprises an elongated portion 31*a* and an expanded portion 31*b*. Similarly, the scan electrode 32 comprises an elongated portion 32*a* and an expanded portion 32*b*. The elongated portions 31*a* and 32*a* are elongated in the second (x-axis) direction, corresponding to opposite sides of each of the discharge spaces 38*a* and 38*b*. The expanded portions 31*b* and 32*b* are extend from the respective elongated portions 31*a* and 32*a* toward and perpendicular to the rear substrate 10 (e.g., in the z-axis direction). In the illustrated embodiment, the elongated portion 31*a* of the sustain electrode is dimensioned and configured to correspond to the elongated portion 32*a* of the scan electrode, and the expanded portion 31*b* of the sustain electrode is dimensioned and configured to correspond to the expanded portion 32*b*. In some embodiments, the height ($h_v$) of at least one of the expanded portions 31*b* and 32*b* of the sustain and scan electrodes is greater than the width ($h_h$) thereof. An opposed discharge between the illustrated sustain and scan electrodes comprising expanded portions 31*b* and 32*b*, generates more intense vacuum ultraviolet (VUV) radiation, which in turn generates more intense visible light compared with similar sustain and scan electrodes that do not comprise expanded portions.

Figure 4:
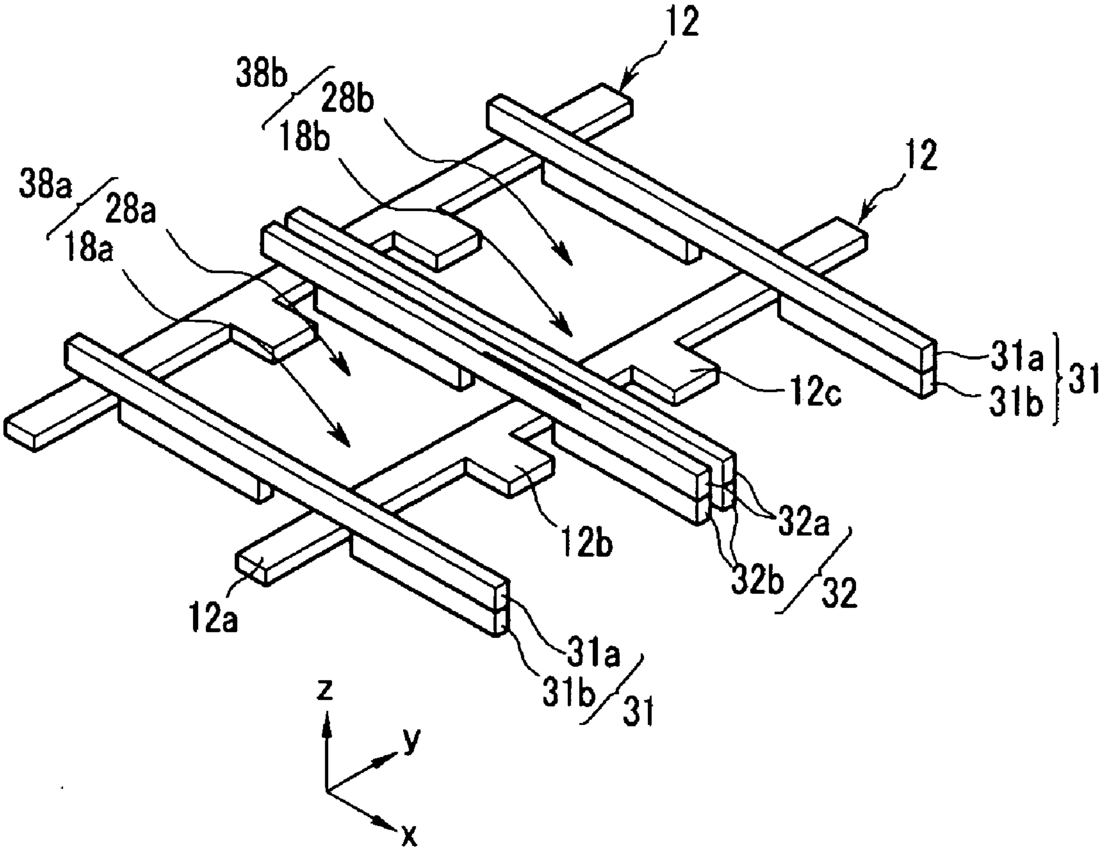
FIG. 4 is a schematic perspective view illustrating the arrangement of electrodes in a PDP according to a first exemplary embodiment of the present invention.

In the configuration illustrated in FIG. 4, the sustain and scan electrodes 31 and 32 are substantially perpendicular to the address electrodes 12, with the expanded portions 31*b* and 32*b* of the sustain and scan electrodes extending toward and perpendicular to the rear substrate 10. In the illustrated configuration, the sustain and scan electrodes 31 and 32 do not spatially interfere with the address electrodes 12, including the first and second protruding portions 12*b* and 12*c*.

In the embodiment illustrated in FIG. 3, the rearmost or distal portions of the sustain and scan electrodes 31 and 32 are closer to the front substrate 20 than the frontmost or proximal portions of the address electrode 12. This configuration permits forming the sustain electrodes 31 and the scan electrodes 32 after forming the address electrodes 12.

In some preferred embodiments, at least one of the sustain electrode 31, the scan electrode 32, and/or the address electrode 12 comprises a highly conductive metal electrode, which is opaque. Because the address 12, sustain 31, and scan 32 electrodes are disposed at the edges or sides of the discharge spaces 18 and 28 in the illustrated embodiments, they block only a small amount of the visible light generated in the discharge cell 38, even when fabricated from an opaque material.

As illustrated in FIGS. 1 and 3, the dielectric layers 34 are formed over the sustain electrode 31 and the scan electrode 32. The dielectric layer 35 is formed over the address electrode 12. The dielectric layers 34 and 35 both collect wall charges and electrically insulate the electrodes. In some preferred embodiments, at least some of the dielectric layers 34 and 35, and/or the electrodes 31, 32, and 12 enclosed therein are fabricated by a thick film ceramic sheet (TFCS) method. For example, in some embodiments, the sustain electrode 31, the scan electrode 32, and the address electrode 12 are fabricated as a separate electrode unit, which is then joined with the rear-plate barrier ribs 16 and the rear substrate 10.

In the embodiment illustrated in FIG. 3, a separate dielectric layer 34 is formed over each of the pair of scan electrodes 32. In other embodiments, a single dielectric layer 34 is formed over both scan electrodes 32. For example, in the embodiment illustrated in FIG. 6, the two scan electrodes 232 are both covered by a single dielectric layer 234 having a hollow space between the two scan electrodes 232. In some embodiments, a discharge gas is disposed in the hollow space. In the embodiment illustrated in FIG. 7, the two scan electrodes 332 are covered by a single, integral dielectric layer 334 that does not comprise a hollow space between the scan electrodes 332.

In the embodiment illustrated in FIG. 1, a protective layer 36 is formed on surfaces of the dielectric layers 34 and 35. In some embodiments, the protective layer 36 is formed over portions of at least one of the dielectric layers 34, 234, 334, and/or 35 exposed to a plasma discharge in the discharge cell 38. In some embodiments, the protective layer 36 protects at least one of the dielectric layers 34, 234, 334, and/or 35 from the plasma discharge and/or provides a high secondary electron emission coefficient. In the embodiment illustrated in FIG. 1, the protective layer is not necessarily transparent to visible light. Because the sustain electrode 31, the scan electrode 32, and the address electrode 12 are disposed at the edges or borders of the discharge spaces 18 and 28, and not formed on the front and/or rear substrates 20 and 10, in some embodiments, the protective layer 36 comprises opaque MgO. Opaque MgO typically exhibits a much higher secondary electron emission coefficient compared with transparent MgO, thereby permitting the use of a lower discharge firing voltage in some embodiments.

As described above, in the illustrated embodiment, sustain electrodes 31 are provided at both sides of the discharge cell 38 at the y-axis direction boundaries, and a pair of scan electrodes 32 is provided between the sustain electrodes 31, substantially at the center of the discharge cell 38. In addition, address electrodes 12 are disposed at the x-axis direction boundaries of the discharge cell 38.

In the embodiment illustrated in FIG. 2, the first and second protruding portions 12*b* and 12*c* of the address electrode 12 are formed closer to the scan electrodes and farther from the sustain electrodes 31. That is, the first and second protruding portions 12*b* and 12*c* of the address electrode 12 are biased toward the corresponding scan electrodes 32.

In the illustrated embodiment, the distance $d_1$ between the scan electrodes 32 and the protruding portions 12*b* and/or 12*c* of the address electrode 12 is less than a distance $d_2$ between the protruding portions 12*b* and/or 12*c* and the sustain electrodes 31 (i.e., $d_1 < d_2$).

By applying an address pulse to the address electrode 12 and a scan pulse to the appropriate scan electrode 32, either discharge space 38*a* or discharge space 38*b* may be selected.

The address electrode 12 is enclosed by a dielectric layer 35 having a same dielectric constant, and thus the same discharge firing voltage is formed at phosphor of red R, green G and blue B colors, thereby enabling a large voltage margin. Generally, the phosphors of red R, green G and blue B colors have different dielectric constants. If the address electrodes are enclosed by the dielectric layer having the same dielectric constant, and the phosphors of red R, green G and blue B colors are formed on the dielectric layer, different discharge firing voltages will be formed at phosphors of red R, green G and blue B colors by the different dielectric constants, thereby enabling a small voltage margin.

In other embodiments, the distance $d_1$ between the scan electrodes 32 and the protruding portions 12*b* and/or 12*c* of the address electrode 12 is greater than or equal to the distance $d_2$ between the protruding portions 12*b* and/or 12*c* and the sustain electrodes 31 (i.e., $d_1 \geqq d_2$). A higher voltage is required for the address discharge in some of these embodiments.

Figure 5:
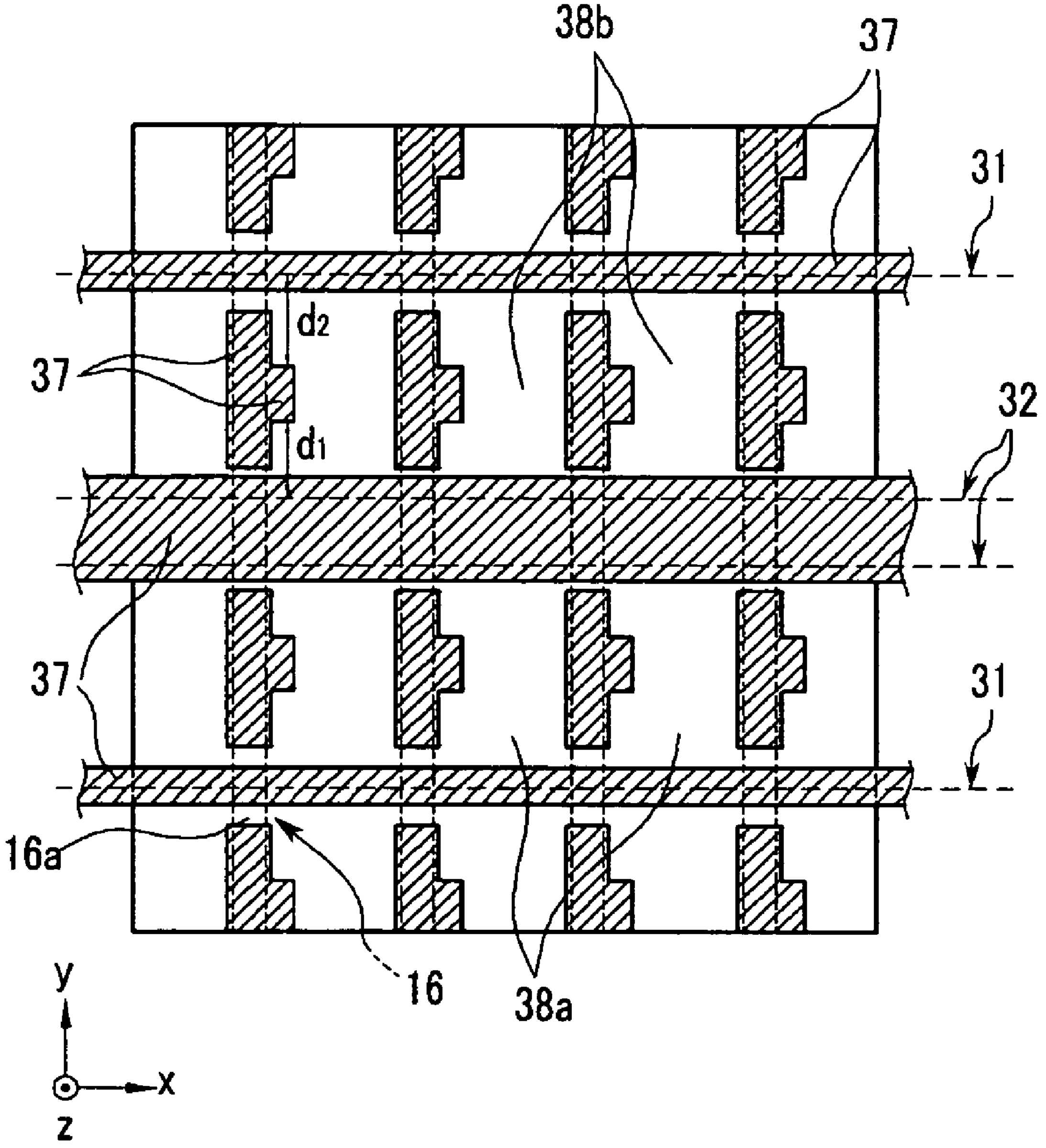
FIG. 5 is a top plan view illustrating a relationship between discharge cells and a dark mask layer in a PDP according to a first exemplary embodiment of the present invention.

In the embodiment illustrated in FIG. 5, a dark mask layer 37 is disposed on the front substrate 20, thereby enhancing the contrast of the PDP. In some embodiments, at least some portions of the dark mask layer 37 are black. In the embodiment illustrated in FIG. 3, the dark mask layer 37 is formed on a surface of the front substrate 20. The second phosphor layer 29 is then formed thereover. In another embodiment (not illustrated), the dark mask layer 37 is formed over the second phosphor layer 29, which is formed on the front substrate 20. In the illustrated embodiments, dark mask layer 37 is disposed between the front substrate 20, and the address electrode 12, the sustain electrode 31, and the scan electrode 32. In the illustrated embodiments, the dark mask layer 37 substantially covers the address 12, sustain 31, and scan 32 electrodes, thereby enhancing the contrast of the device by absorbing incident external light and enhancing luminescence efficiency by reducing reflection of incident external light.

As described above, in some embodiments, sustain electrodes 31 are disposed at the y-axis boundaries of the discharge cells 38 and a pair of scan electrodes 32 is disposed between the sustain electrodes 31. In the illustrated embodiment, discharge cells 38 adjacent in the first direction share the sustain electrode 31 disposed therebetween. This configuration provides a repeated, sequential arrangement of electrodes in the first (y-axis) direction comprising a scan electrode 32, a sustain electrode 31, and a scan electrode 32.

Some embodiments also comprise first and/or second protruding portions 12*b* and/or 12*c* of the address electrode 12 extending between the sustain and scan electrodes 31 and 32. The arrangement of electrodes in the first (y-axis) direction in these embodiments comprises a sustain electrode 31, an address electrode 12*a*, a scan electrode 32, a scan electrode 32, an address electrode 12*b*, and a sustain electrode 31. Those skilled in the art will understand that other configurations are possible.

Hereinafter, various exemplary variations of the first exemplary embodiment will be described in detail. The following exemplary embodiments are similar to the first exemplary embodiment, and accordingly, only differences are described in detail below.

Figure 6:
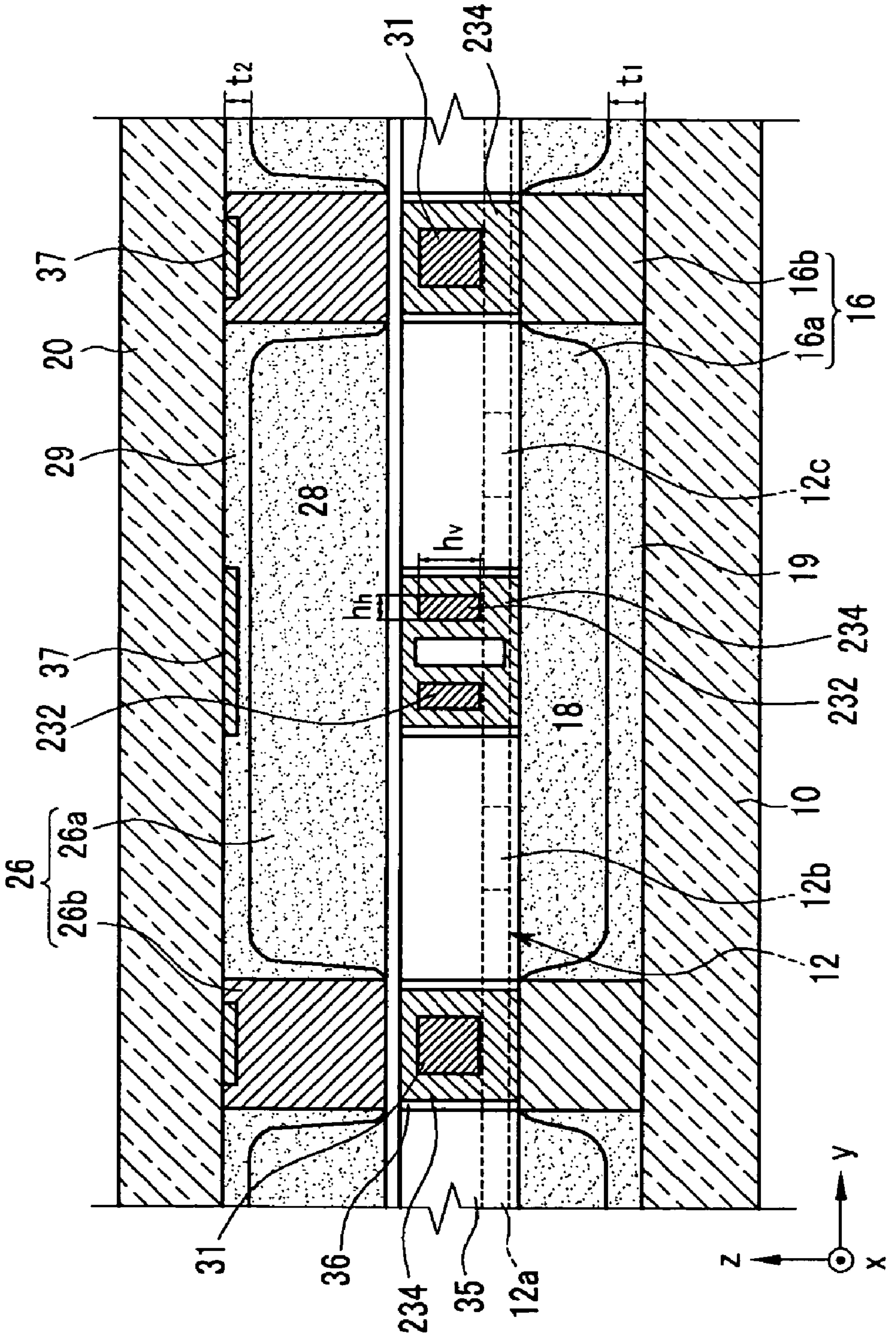
FIG. 6 is a cross-sectional view of a PDP according to a second exemplary embodiment of the present invention, wherein the view corresponds to the section of FIG. 3.
Figure 7:
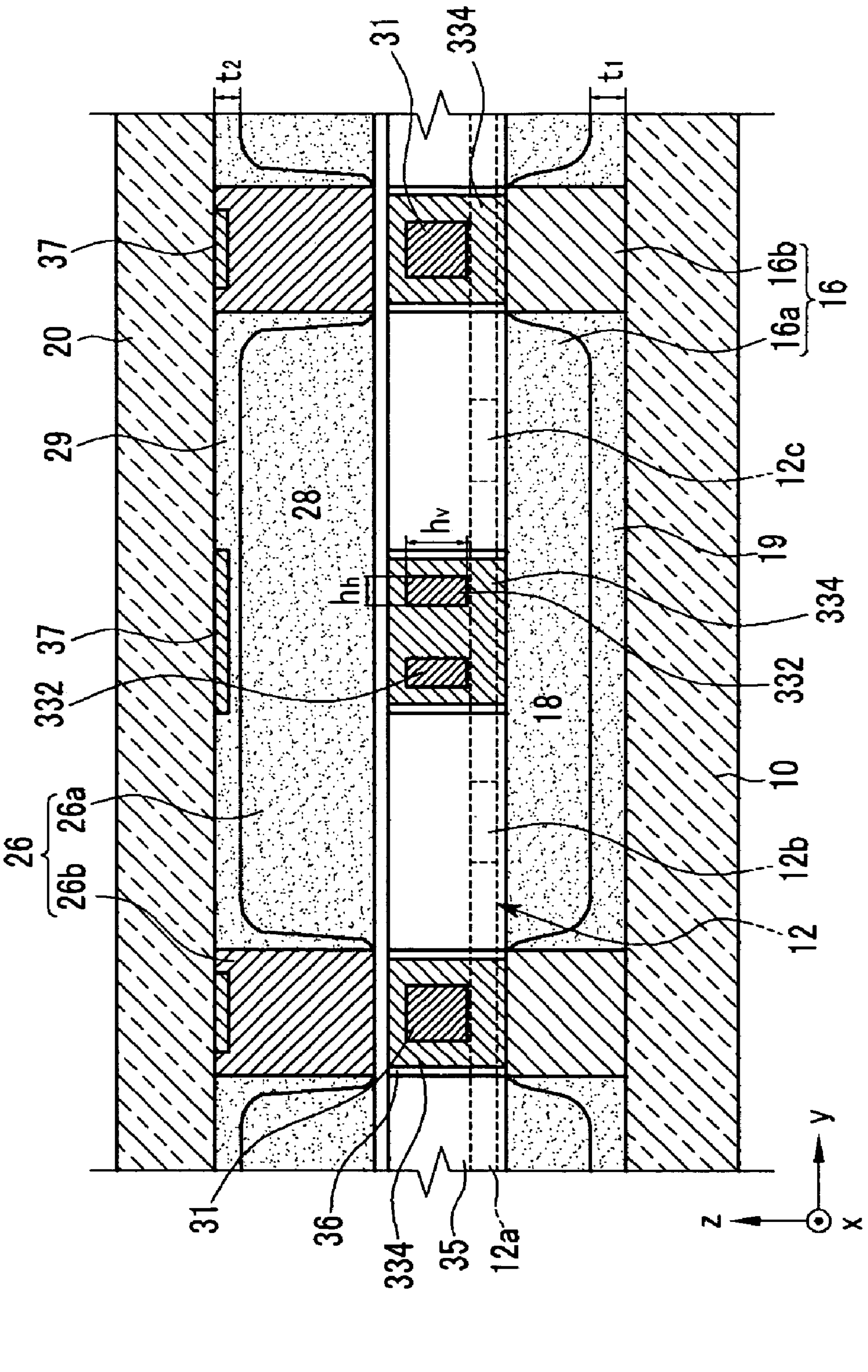
FIG. 7 is a cross-sectional view of a PDP according to a third exemplary embodiment of the present invention, wherein the view corresponds to the section of FIG. 3.

FIG. 6 and FIG. 7, respectively, relate to second and third exemplary embodiments, in which the structures of the dielectric layers 234 and 334 differ from the dielectric layer 34 of the first exemplary embodiment.

In addition, the second and third exemplary embodiments further comprise different structures for the rear-plate barrier rib 16 and the front-plate barrier rib 26 compared with the first exemplary embodiment. The rear-plate barrier rib 16 in the embodiments illustrated in FIGS. 6 and 7 is further provided with a third barrier rib member 16*b*. The third barrier rib member 16*b* is elongated in the second (x-axis) direction, intersecting the first barrier rib member 16*a*. The third barrier rib member 16*b* extends toward the front substrate 10. In the illustrated embodiments, the first and third barrier rib members 16*a* and 16*b* of the rear-plate barrier rib 16 partition the discharge spaces 18*a* and 18*b* formed on the rear substrate 10. In these embodiments, the discharge spaces 18*a* and 18*b* are separated from each other by the third barrier rib members 16*b*. In contrast, in the embodiments described above, the discharge spaces 18*a* and 18*b* are not physically separated from each other.

In the illustrated embodiments, the front-plate barrier rib 26 further comprises a fourth barrier rib member 26*b*. The fourth barrier rib member 26*b* is elongated in the second (x-axis) direction, intersecting the second barrier rib member 26*a*. The fourth barrier rib member 26*b* extends toward the rear substrate 10. In the illustrated embodiment, the fourth barrier rib member 26*b* is dimensioned and configured to correspond to the third barrier rib member 16*b*, as illustrated in FIG. 6 and FIG. 7. In the illustrated embodiments, the second and fourth barrier rib members 26*a* and 26*b* of the front-plate barrier rib 26 partition the discharge spaces 28*a* and 28*b* formed on the rear substrate 10. In these embodiments, the discharge spaces 28*a* and 28*b* are separated from each other. In contrast, in some the embodiments described above, the discharge spaces 28*a* and 28*b* are not separated from each other.

Figure 8:
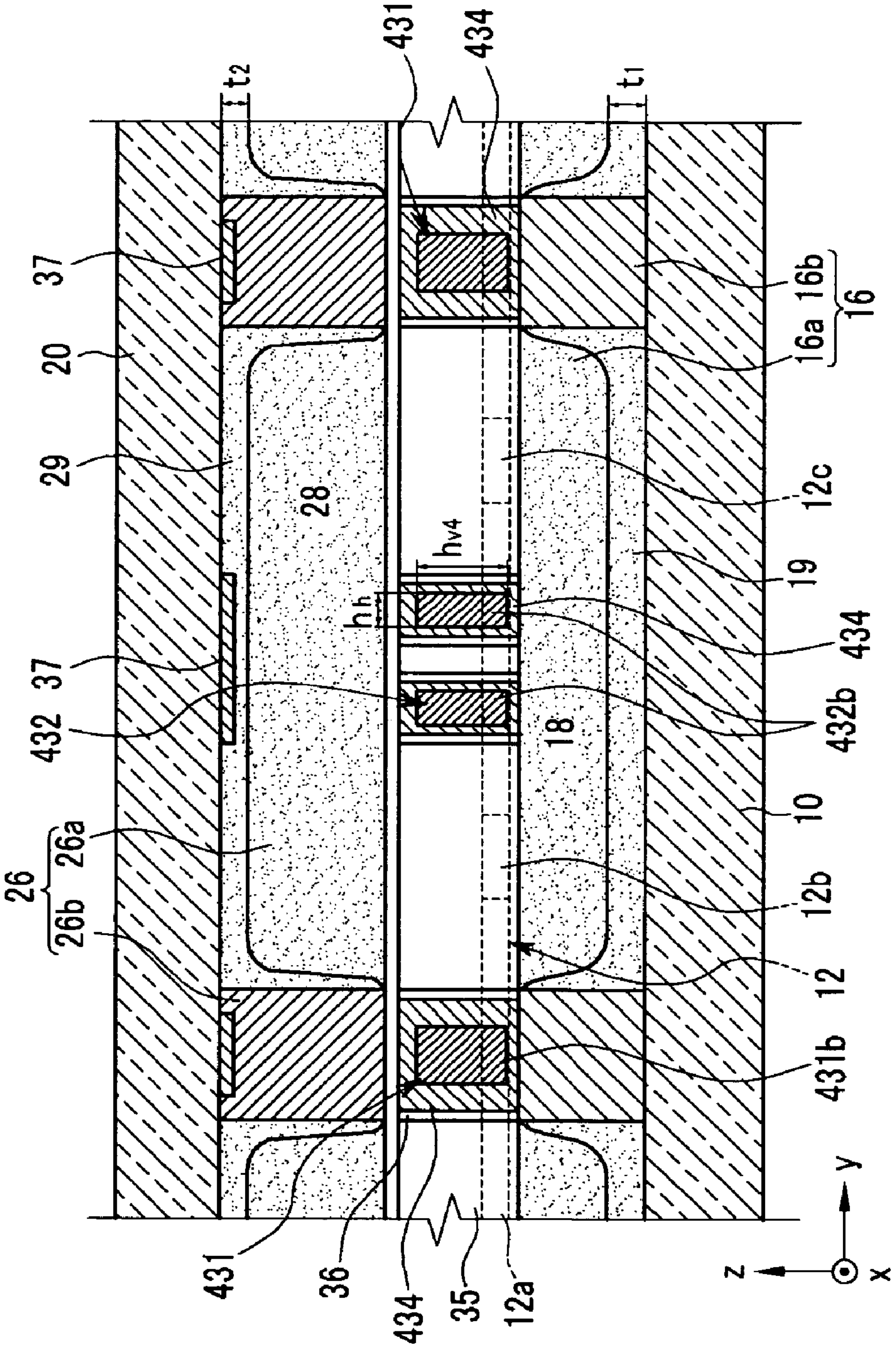
FIG. 8 is a cross-sectional view of a PDP according to a fourth exemplary embodiment of the present invention, wherein the view corresponds to the section of FIG. 3.

FIG. 8 illustrates a fourth exemplary embodiment. Unlike the embodiment described above and illustrated in FIG. 3, in this embodiment, the rearmost portion of at least one of a sustain electrode 431 and/or a scan electrode 432 overlaps at least a portion of the address electrode 12 in the vertical (z-axis) direction. The height ($h_{v4}$) of at least one of the expanded portions 431*b* and 432*b* of the sustain and scan electrodes is greater than the height ($h_v$) of at least one of the expanded portions 31*b* and 32*b* of the sustain and scan electrodes. The illustrated embodiment comprises barrier rib structures 16 and 26 similar to those described above for the second and third exemplary embodiments. Other embodiments use different barrier rib structures 16 and 26, for example, as described above for the first exemplary embodiment.

Figure 9:
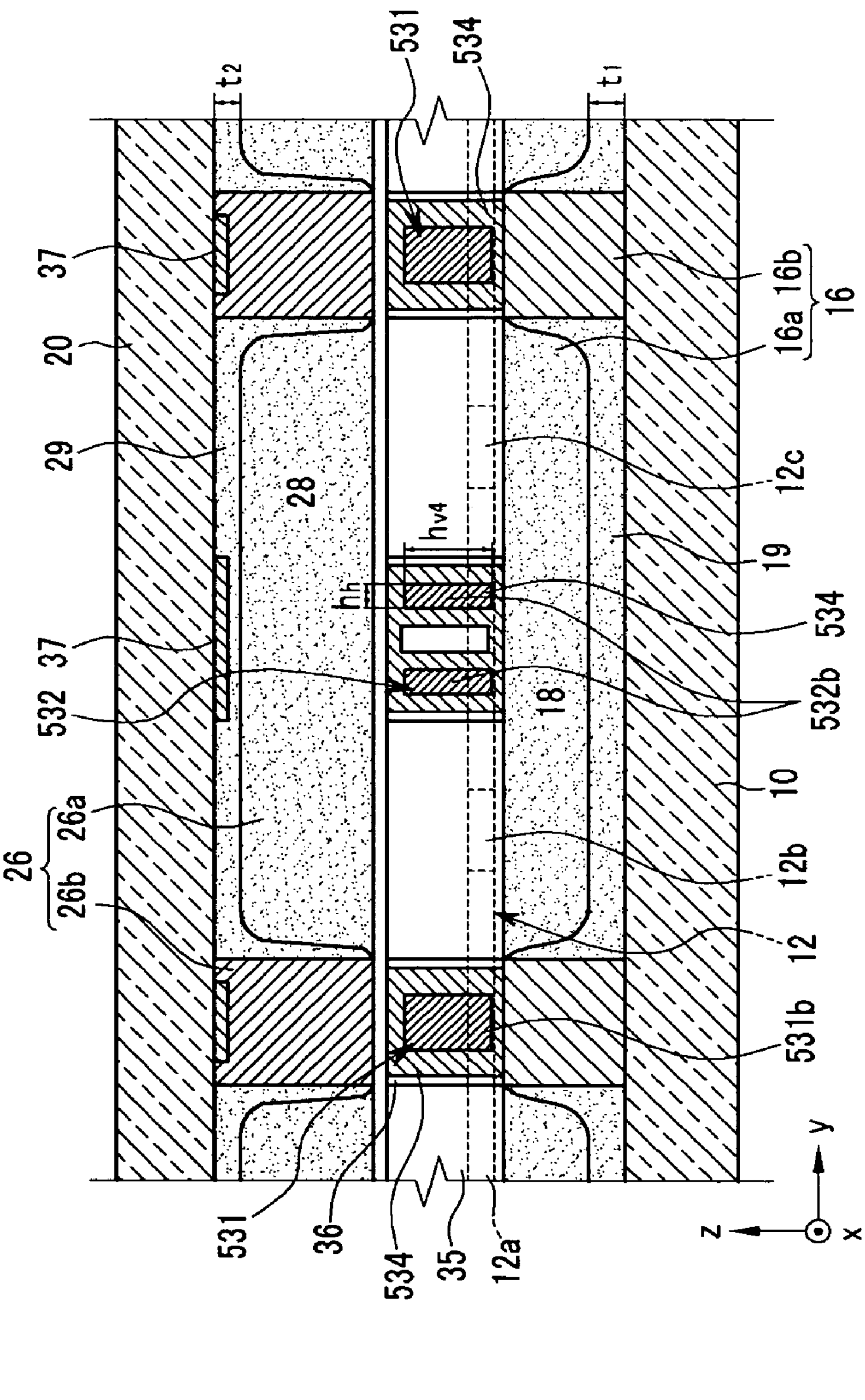
FIG. 9 is a cross-sectional view of a PDP according to a fifth exemplary embodiment of the present invention, wherein the view corresponds to the section of FIG. 3.

FIG. 9 illustrates a fifth exemplary embodiment, Compared with the second exemplary embodiment described above and illustrated in FIG. 6, in the illustrated embodiment, the rearmost portion at least one sustain electrode 531 and/or scan electrode 532 overlaps at least a portion of the address electrode 12 in the vertical (z-axis) direction. The illustrated embodiment comprises barrier rib structures 16 and 26 similar to those described above for the second and third exemplary embodiments. Other embodiments use different barrier rib structures 16 and 26, for example, as described above for the first exemplary embodiment.

In addition, although not shown and described in further detail, those skilled in the art will understand that the above-described features of the fourth and fifth exemplary embodiments are also applicable to other embodiments, for example, to the third exemplary embodiment illustrated in FIG. 7, as well as to other embodiments that are not illustrated herein.

According to the fourth and fifth exemplary embodiments, the protruding portions 12*b* and 12*c* of the address electrode 12 are disposed in closer proximity to the scan electrodes 432 and 532. Accordingly, in some embodiments, an address discharge is triggered by a lower voltage.

In addition, according to the fourth or the fifth exemplary embodiments, the areas of the expanded portions 431*b* or 531*b* of the sustain electrode 431 or 531 and the expanded portions 432*b* or 532*b* of the scan electrode 432 or 532 that face each other are larger than in the first or the second exemplary embodiments described above. Therefore, in some embodiments, the intensity of the VUV radiation is higher than in the first or second exemplary embodiments. The more intense VUV radiation is absorbed by the phosphor layers 19 and 29 in the discharge spaces 18 and 28, thereby increasing the emission of visible light.

As described above, some embodiments of a PDP described herein comprise a plurality of display electrodes disposed between rear and front substrates, wherein a pair of the display electrodes are sustain electrodes disposed at opposite sides of a discharge cell, and another pair of the display electrodes are scan electrode disposed between the sustain electrodes, substantially at a center of the discharge cell. This configuration of display electrodes permits an opposed discharge between the scan and sustain electrodes, thereby lowering the discharge firing voltage in some embodiments. Some embodiments comprise phosphor layers disposed at both of the rear and the front substrates, thereby improving luminescence efficiency.

Furthermore, some embodiments provide a PDP configured for an opposed discharge between the scan and address electrodes during an address discharge. In these embodiments, scan electrodes are disposed between a pair of discharge spaces and protruding portions of an address electrode are disposed at both sides of the scan electrodes, with a short gap between each scan electrode and a protruding portion of the address electrode. Therefore, the address discharge is a short gap discharge between the scan electrodes and the protruding portions of the address electrode, thereby lowering the discharge firing voltage of the address discharge in some embodiments.

While this invention has been described in connection with and illustrated by certain exemplary embodiments, it is to be understood that the invention is not limited to the disclosed embodiments, but is intended to cover various modifications and equivalent arrangements included within the spirit and scope of the appended claims.

What is claimed is:

1. A plasma display panel, comprising:

first and second substrates facing each other with a gap therebetween;

a plurality of discharge cells formed in the gap between the first and second substrates, wherein each discharge cell comprises first and second adjacent discharge spaces;

an address electrode elongated in a first direction disposed between the first and second substrates;

a pair of first electrodes disposed between the first and second substrates and elongated in a second direction that crosses the first direction, the pair of first electrodes being disposed at opposite sides of the first and second discharge spaces, and separated from the address electrode; and a pair of second substantially parallel electrodes elongated in the second direction, the pair of second electrodes being disposed at adjacent sides of the first and second discharge spaces between the pair of first electrodes, wherein each of the first and second discharge spaces is associated with one of the first electrodes and one of the second electrodes, wherein the address electrode comprises:

an elongated portion elongated in the first direction and disposed at a boundary of the discharge cell;

a first protruding portion extending from the elongated portion of the address electrode toward an interior of the first discharge space; and a second protruding portion extending from the elongated portion of the address electrode toward an interior of the second discharge space.

2. The plasma display panel of claim 1, wherein the first protruding portion of the address electrode extends between the first and second electrodes in the first discharge space.

3. The plasma display panel of claim 1, wherein the second protruding portion of the address electrode extends between the first and second electrodes in the second discharge space.

4. The plasma display panel of claim 1, wherein the first and second protruding portions of the address electrode are biased toward the respective second electrodes of each discharge space.

5. The plasma display panel of claim 1, wherein for each discharge space, a distance between the second electrode and the protruding portion of the address electrode therein is smaller than a distance between the first electrode and the protruding portion of the address electrode therein.

6. The plasma display panel of claim 1, wherein at least one first electrode is shared by discharge cells adjacent in the first direction.

7. The plasma display panel of claim 1, wherein at least one first electrode comprises:

an elongated portion disposed at the opposite sides of the discharge cell and elongated in the second direction; and an expanded portion extending from the elongated portion in a direction perpendicular to the first substrate.

8. The plasma display panel of claim 7, wherein at least one second electrode comprises:

an elongated portion dimensioned and configured to correspond to the elongated portion of the at least one first electrode; and an expanded portion corresponding dimensioned and configured to correspond to the expanded portion of the at least one first electrode.

9. The plasma display panel of claim 1, wherein the rearmost portion of at least one of the first and second electrodes is closer to the front substrate than the frontmost portion of the address electrode.

10. The plasma display panel of claim 1, wherein rearmost portion of at least one of the first and second electrodes overlaps the address electrode vertically.

11. The plasma display panel of claim 1, wherein at least one of the first and second electrodes comprise metal electrode.

12. The plasma display panel of claim 1, wherein an insulating dielectric layer is disposed on at least one of the first electrodes, the second electrodes, and the address electrode.

13. The plasma display panel of claim 12, wherein a protective layer is disposed on at least one of the dielectric layers.

14. The plasma display panel of claim 12, wherein a separate dielectric layer is disposed on each of the pair of second electrodes.

15. The plasma display panel of claim 12, wherein a single dielectric layer is disposed on the pair of second electrodes.

16. The plasma display panel of claim 15, wherein the dielectric layer disposed on the pair of second electrodes does not include a void or hollow space between the pair of second electrodes.

17. The plasma display panel of claim 1, further comprising:

a first barrier rib layer formed on the first substrate, which forms a first substrate side discharge space of the discharge cell; and a second barrier rib layer formed on the second substrate, which forms a second substrate side discharge space of the discharge cell.

18. The plasma display panel of claim 17, wherein the volume of the second substrate side discharge space is larger than the first substrate side discharge space.

19. The plasma display panel of claim 17, wherein:

the first barrier rib layer comprises a first barrier rib member elongated in the first direction; and the second barrier rib layer comprises a second barrier rib member elongated in the first direction.

20. The plasma display panel of claim 19, wherein:

the first barrier rib layer further comprises a third barrier rib member crossing the first barrier rib member; and the second barrier rib layer further comprises a fourth barrier rib member crossing the second barrier rib member.

21. The plasma display panel of claim 1, further comprising:

a first phosphor layer formed on a surface of the first substrate; and a second phosphor layer formed on a surface of the second substrate.

22. The plasma display panel of claim 21, wherein the first phosphor layer is thicker than the second phosphor layer.

23. The plasma display panel of claim 1, wherein a dark mask layer is formed proximal to the second substrate, wherein the shape of the dark mask layer substantially corresponds to the shape of at least one of the address electrode, a first electrode, and a second electrode.

24. The plasma display panel of claim 1, wherein:

a sustain pulse is applied to the first electrode in a sustain period;

a scan pulse is applied to the second electrode in the address period;

a sustain pulse is applied to the second electrode in the sustain period; and the first electrodes are shared by discharge cells adjacent in the first direction, wherein the first and second electrodes are repeated in the first direction in an arrangement comprising a second electrode, a first electrode, and a second electrode.

25. The plasma display panel of claim 24, wherein the address electrode comprises:

an elongated portion elongated in the first direction and disposed at a boundary of the discharge cell;

a first protruding portion extending from the elongated portion of the address electrode toward an interior of the first discharge space; and a second protruding portion extending from the elongated portion of the address electrode toward an interior of the second discharge space, wherein the first, second, and address electrodes are repeated in the first direction in an arrangement comprising a second electrode, an address electrode, a first electrode, the address electrode, and a second electrode.

* * * * *